PRINTED CIRCUIT MULTIPLE CONNECTOR BLOCK

Original Filed Feb. 11, 1957 2 Sheets-Sheet 1

INVENTOR.
ROBERT C. SWENGEL
BY
Curtis, Morris & Safford

Nov. 26, 1963 R. C. SWENGEL 3,112,145

PRINTED CIRCUIT MULTIPLE CONNECTOR BLOCK

Original Filed Feb. 11, 1957 2 Sheets-Sheet 2

INVENTOR.
ROBERT C. SWENGEL
BY
Curtis, Morris + Safford 3,112,145
Patented Nov. 26, 1963

1

3,112,145

PRINTED CIRCUIT MULTIPLE CONNECTOR BLOCK

Robert C. Swengel, Hellam, Pa., assignor to AMP Incorporated, Harrisburg, Pa.

Original application Feb. 11, 1957, Ser. No. 639,461, now Patent No. 2,980,878, dated Apr. 18, 1961. Divided and this application June 22, 1960, Ser. No. 46,855
1 Claim. (Cl. 339—17)

This invention relates to printed circuit connections and more particularly to an improved printed circuit board or panel and terminal clips cooperable therewith for making connections between the electrical network defined by the printed circuit board and electrical circuitry external to the printed circuit board. This application is a division of my copending application, Serial No. 639,461, filed February 11, 1957, now Patent No. 2,980,878, issued April 18, 1961.

As used herein, the term printed circuit board includes a supporting base or body of any suitable insulating material on which the electrical wiring of an electronic circuit is reproduced by any suitable process such as chemical deposition, die stamping, painting, etc. The circuit design may encompass both sides of the panel and may be printed with or without other circuit parameters such as resistors, capacitors, etc., the wiring usually taking the form of extremely thin and narrow strips or ribbons of electrically conductive material such as copper, silver, or tin, or a combination thereof.

It is an object of the present invention to provide electrical connections with printed circuit boards which are simple in construction and in installation and inexpensive to produce;

Another object is to provide a printed circuit connection for external wiring which may readily be disconnected for disassociating the printed circuit unit from the remainder of the system;

Another object of the present invention is to provide a printed circuit panel connection wherein an external lead wire is directly coupled to the printed circuit conductive ribbons through a single solderless terminal part;

Still another object is to provide in a friction fit connection for printed circuit panels, connector parts which are self-cleansing, require low connective forces, but result in high contact pressures over the contact areas without damage to the conductive ribbons of the printed circuit panel;

Still another object is to provide in a frictional fit connection for printed circuit panels, a terminal clip sufficiently resilient to accept wide variations in thickness of the insulation body and to overcome plastic creep of the insulation under load;

A still further object is to provide in a frictional fit connection for printed circuit panels a terminal clip which promotes the circulation of air for ventilation purposes and avoids entrapment of moisture or other foreign matter within the connector parts;

A still further object is to provide in a friction fit connection for printed circuit panels a terminal clip which is mechanically stable under vibration or externally imposed stresses on the lead-in wires.

In general these and other objectives are attained in accordance with the present invention by providing in a printed circuit panel a plurality of slots which extend inwardly from one or more of the side edges of the panel, the number of slots corresponding to the number of external connections desired. Incorporated within the circuit design printed on the panel are a number of conductive ribbons leading from the input and output junctions of the circuitry involved, which ribbons extend to the panel side edges along and adjacent appropriate slots.

2

These slots are adapted to receive a sheet metal terminal which includes a coupling portion adapted for solderless connection to electrical circuitry, such as a lead-in wire external of the panel, and a clip portion which comprises a base and resilient spring elements extending from the base, for example a pair of lateral arms extending from opposite sides of and turned back upon the base. In connection the clip base is received within an appropriate panel slot with the end edges of the spring arms gripping the panel resiliently therebetween with at least one of the end edges bearing upon an adjacent lead ribbon.

Other objects and attainments of the present invention will become apparent to those skilled in the art upon a reading of the following detailed description when taken in conjunction with the drawings in which there are shown and described illustrative embodiments of the invention; it is to be understood however that these embodiments are not intended to be exhaustive nor limiting on the scope of the invention but are given for purposes of illustration in order that others skilled in the art may fully understand the invention and the principles thereof and the manner of applying it in practical use so that they may modify it in various forms each as may be best suited to the conditions of a particular use.

Figures 1, 2:
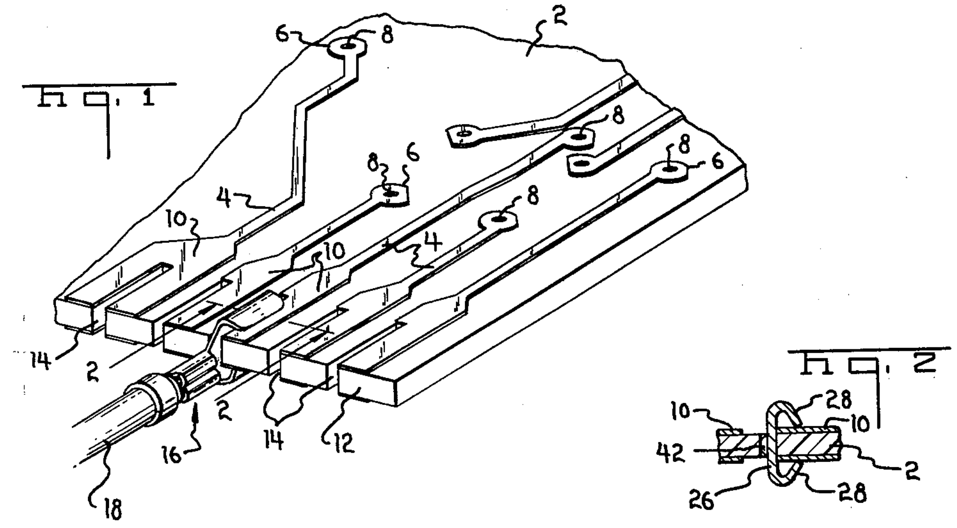
FIGURE 1 is a fragmentary view in perspective of a printed circuit board having connections made in accordance with the present invention.
FIGURE 2 is a sectional view taken along lines 2—2 of FIGURE 1.

Referring now to FIGURE 1, a printed circuit board panel or body 2 of suitable insulation material has reproduced thereon a circuit pattern or design including a plurality of thin narrow strips or ribbons 4 of conductive material which represent the intercomponent wiring of an electronic assembly. The ends 6 of some of strips 4 terminate at apertures 8 into which the leads of components, not shown, such as resistors, coils, tubes, etc., are inserted and then soldered, all as is conventional in the art. The printed circuit design may be composed of strips 4 on either, or as is the usual case, on both sides of panel 2, the connection of my invention being applicable in either case.

The segments or strip ends 10 which constitute the input and output leads of the circuit defined by strips 4 are brought, in accordance with the present invention, to any side edge 12 of panel 2, and, for reasons to become apparent, preferably are widened to several times the approximate 0.025 inch strip width usually sufficient for strips 4. Extending inwardly of side edge 12 adjacent and along strip ends 10 respectively are a plurality of slots 14, each being adapted to receive in electrical connection with the associated strip end 10 a terminal 16 attached to the end of an external lead 18. By bringing strip ends 10 to various edges of the board, it will be apparent that like connections may be made on any side of panel 2 although, as is shown in FIGURE 1, all connections are conveniently made in practice along one side edge 12. The connection afforded by terminal 16 thus serves to couple external lead wire 18 to the desired input or output strip end 10, any desired number of such connections being provided, corresponding, for example, to the number of input or output leads required to complete incorporation of the circuit of the printed circuit board within the electrical equipment involved.

Figure 3:
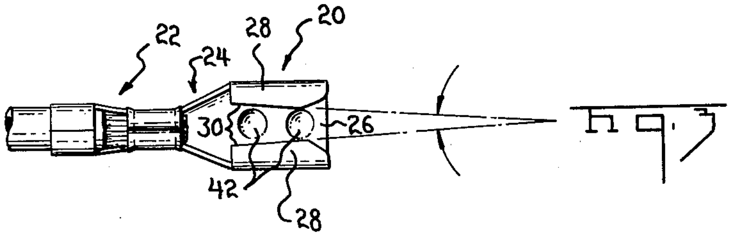
FIGURE 3 is a plan view of a connector for making one of the connections shown in FIGURE 1.

Terminal 16, of suitably resilient sheet metal such as No. 4 hard brass, includes a clip portion 20, FIGURE 3, for contacting strip ends 10, and a coupling portion 22 integrally connected to clip 20 by transition section 24, coupling portion 22 being adapted to affix the terminal electrically and mechanically to lead wire 18 as generally indicated in FIGURES 1 and 3. With additional reference to FIGURES 2 and 4, clip 20 comprises a generally rectangular base 26 adapted to be slipped within a slot 14 at right angles to panel 2, and opposed spring arms 28 extending from opposite sides of and turned back upon base 26 to determine in longitudinally directed linear end edges 30 spaced to engage resiliently the upper and lower faces of panel 2, FIGURE 2. More particularly, arms 28 are turned back upon base 26 about radii of curvature as large as possible to avoid concentration of stresses during flexure, and extend linearly thereafter outwardly from base 26 to form therewith an open-ended channel for receiving an edge portion of panel 2 as defined by one side of a slot 14. Edges 30, however, are spaced less than any anticipated thickness of panel 2 so that on assembling the connection, these edges forcibly bear on the opposed surfaces of the board and on the conductive strips with which the slot is associated.

In general coupling portion 22 may take a variety of forms but is solderless in nature, that is, a ferrule-forming part adapted to be cold crimped onto the end of lead wire 18 by solderless techniques well known in the art. Such a ferrule typically includes, FIGURE 4, a U-shaped portion having first upstanding ears 32 adapted for turning inwardly and downwardly upon the exposed metallic core of lead 18 and a second pair of ears 34 which are formed about the insulation, if any, of the lead in the crimping process. Alternatively, coupling portion 22 may be omitted where the function to be served is to couple opposed strips on the upper and lower surfaces of the board. Transition section 24 serves to reduce the wider clip portion to the width of coupling portion 22 and is flanged at edges 36 to lend rigidity to the construction.

Figures 4, 5:
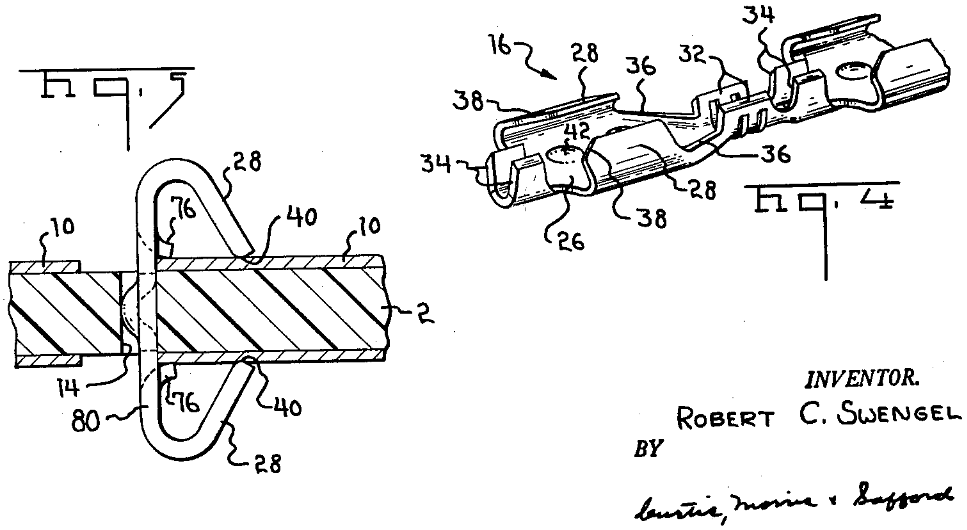
FIGURE 4 is a fragmentary view in perspective of a strip of sheet metal electrical terminals for making one of the connections shown in FIGURE 1, the terminals being adapted for application to lead wires by automatic or semi-automatic crimping machines.
FIGURE 5 is a sectional view of a further embodiment of the printed circuit board connection according to the present invention.

It will be apparent that terminal 16 may be formed from sheet metal by conventional blanking and shaping techniques well known in the art, conveniently in strip form, that is, a string of terminals wherein each terminal is joined to others either in end-to-end fashion, FIGURE 4, or in ladder form, not shown. When thus formed the terminals may be wound in reels for application to leads 18 by automatic or semi-automatic crimping machines.

With coupling portion 22 crimped onto the end of lead wire 18, insertion of clip base 26 within a slot 14 and introduction of an edge portion of the board within the channel defined by the clip cause resilient spring arms 26 to be wedged open and end edges 30 to be brought into forceful engagement with strip ends 10 thereby providing the desired solderless connection between lead wire 18 and printed circuit strips 4. To facilitate application of base 26 to the appropriate slot 14 the forward corners 38 of arms 28 are chamfered or bevelled so as to curve away from the insertion end of the clip thus to produce initially a smooth camming action for distending the spring arms. In addition the width of slot 14 will, of course, be wider than the thickness of base 26 to provide a target area of suitable scope for facile indexing of the clip base. The slot width, however, should not be so great as to permit excessive lateral play of the clip which should be stabilized in position as will be described. For reasons to become more apparent the slot width advantageously approximates twice the thickness of the sheet metal forming clip 20.

Electrical continuity between clip 20 and a strip 4 will be seen to be a line contact afforded by end edges 30 bearing on strip ends 10. To avoid damaging the relatively delicate printed circuit strips, typically of the order of .001 inch in thickness, inside corners 40 of end edges 30 are rounded as best shown in the enlarged cross sectional view of FIGURE 5.

In making the connection, as the clip is slipped into position, the relatively harder metal of the clip is caused at end edges 30 forcefully to bear on a very limited area of the softer metal of the printed circuit strips, commonly a base of copper overlaid with tin. Because of the small area of contact even relatively small distensions of the clip spring arms result in relatively high contact pressures that deform and slightly groove the metal of the strips as end edges 30 progress therealong. Rounded corners 40, however, effectively increase the bearing surface sufficiently to prevent shearing of the conductive strips. Advantageously, the burnishing and grooving action removes any foreign material while exposing fresh metal at the contact surfaces. This self-cleansing action may be enhanced by forming a slight convergence in edges 30 toward the forward or insertion end of the clip, as indicated in FIGURE 3. The increased contact pressure, resulting from a greater deflection of the spring arms, assures an effectively scrubbed line of contact for subsequent engagement by the more rearwardly portions of the spring arms. In this connection in view of the wider width of slot 14 as compared to the sheet metal thickness of base 26, to prevent shifting of the clip off the established clean line of contact on strip end 10, bosses 42 are preferably raised out of the section of base 26 residing within the board thickness to a height which increases the effective thickness of the base to the width of the slot, as best shown in FIGURE 2. Bosses 42, however, should be disposed sufficiently back from the insertion end of the clip so as not to interfere with the indexing of base 26 to the desired slot 14.

FIGURE 5 also illustrates incorporation in base 80 a strain relief to prevent overstressing of the spring arms of the clip. As shown, a pair of opposed tabs 76 are struck inwardly of base 80, the ends of the tabs spaced apart approximately equal to the width or thickness of the printed circuit board. Tabs 76 are short and relatively rigid as compared to spring arms 28 and thus act to absorb any stresses imposed on the terminal upon receiving the panel therebetween.

Figure 6:
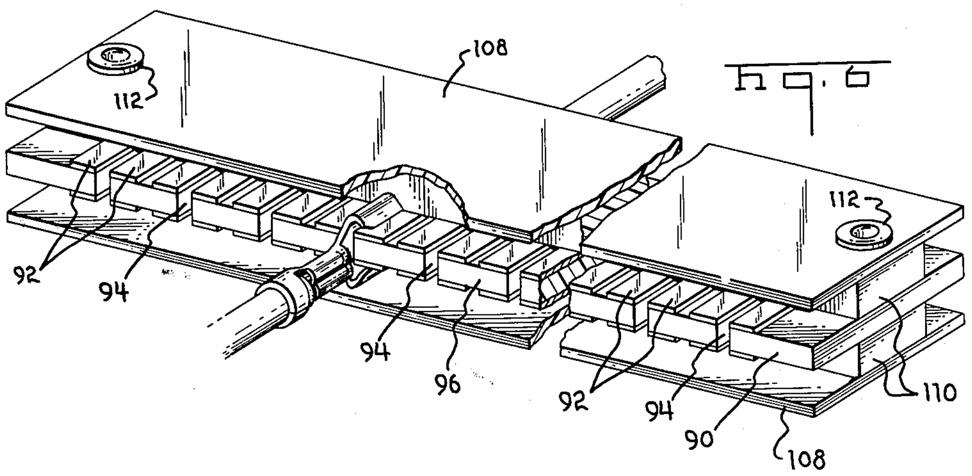
FIGURE 6 is a view in perspective of a terminal block using the printed circuit connections of the present invention.
Figure 7:
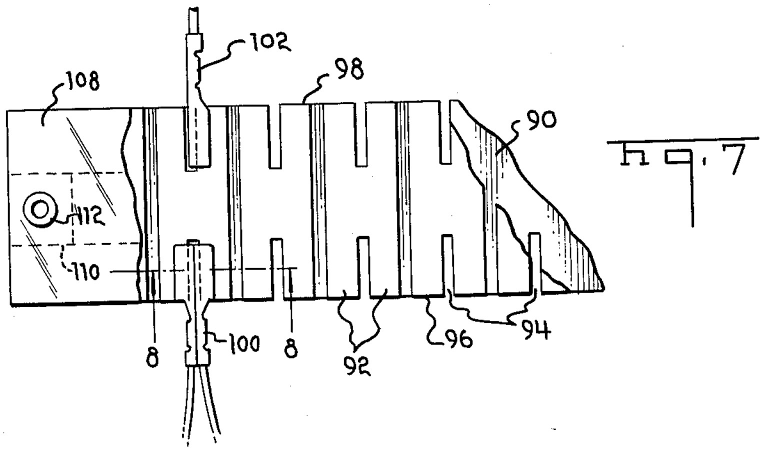
FIGURE 7 is a plan view of the terminal block of FIGURE 6 with parts broken away for purposes of illustration.
Figure 8:
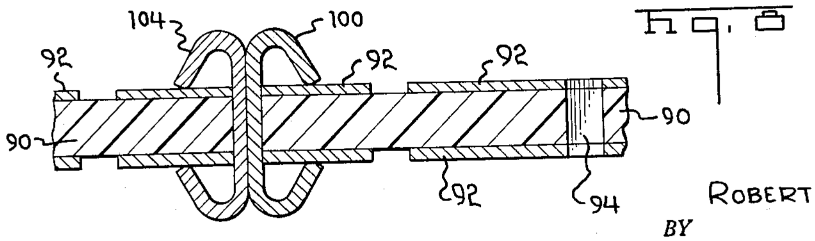
FIGURE 8 is a sectional view taken along lines 8—8 of FIGURE 7.

In FIGURES 6, 7 and 8, printed wiring panel 90 is shown generally rectangular in form and elongated to comprise the connective element of a terminal block arrangement, printed circuit strips 92 extending from associated terminal receiving slots 94 on one long side 96 in any desired pattern or design to the other long side 98 of panel 90. In the illustrated embodiment conductive strips 92 lead directly from the series of slots on one side of panel 90 to respectively opposed slots on the opposite side to provide a series of straight-through connections, for example between terminal 100 on side 96 to terminal 102 on side 98 of the block. In this connection by omitting any space take-up bosses 42 in the base of the terminal clip portion and arranging slots 94 to be centrally disposed in a wider printed circuit strip, a pair of terminals 100 and 104 may be disposed base-to-base, or back-to-back within a single slot, as shown in FIGURES 7 and 8, each strip thus serving as a four-wire common bus. It will be understood, however, that in general by suitably printing strips 92 on either one or both faces of panel 90, a terminal on one side of the board may be connected to any desired number of terminals on either the opposite or same side of the terminal block. Cover plates 108 of insulation material, spatially disposed by spacer blocks 110 and secured relative to panel 90 by eyelets or rivets 112, may be added if desired.

I claim:

A multiple electrical connector comprising a terminal block including a printed circuit board having conductive ribbons extending in parallel uninterrupted continuity across at least one face of the board and terminating at two opposite side edges of the board, slots extending inwardly of said side edges centrally in said ribbons respectively, a plurality of spring clip terminals each having a spring member and a crimp portion fastened onto an individual flexible wire conductor, said terminals being slidably disposed in said slots with the spring members resiliently bearing upon said ribbons respectively, each slot having a width to receive a pair of terminals for contact with one end of a conductive ribbon on either side of the slot, each conductive ribbon directly connecting a pair of said terminals and associated conductors disposed at said side edges respectively.

References Cited in the file of this patent

UNITED STATES PATENTS

| | | |
|---|---|---|
| 1,302,137 | Cook | Apr. 29, 1919 |
| 2,707,272 | Blitz | Apr. 26, 1955 |
| 2,789,278 | Soreng | Apr. 16, 1957 |
| 2,927,251 | Jones | Mar. 1, 1960 |
| 2,931,003 | Huetten et al. | Mar. 29, 1960 |

FOREIGN PATENTS

| | | |
|---|---|---|
| 1,086,548 | France | Aug. 11, 1954 |

OTHER REFERENCES

AMP Electronic Design, Nov. 15, 1956, page 17.